United States Patent
Fulghum et al.

(10) Patent No.: US 6,813,322 B2
(45) Date of Patent: Nov. 2, 2004

(54) SOFT OUTPUT VALUE BIASING

(75) Inventors: Tracy L. Fulghum, Durham, NC (US); Ali S. Khayrallah, Apex, NC (US)

(73) Assignee: Telefonaktiebolaget L.M. Ericsson (publ), Stockholm (SE)

( * ) Notice: Subject to any disclaimer, the term of this patent is extended or adjusted under 35 U.S.C. 154(b) by 321 days.

(21) Appl. No.: 09/843,558

(22) Filed: Apr. 26, 2001

(65) Prior Publication Data

US 2002/0159546 A1 Oct. 31, 2002

(51) Int. Cl.[7] .................................................. H03D 1/00
(52) U.S. Cl. ...................... 375/341; 375/262; 375/340; 764/704; 764/795
(58) Field of Search ................................. 375/341, 347, 375/331, 262, 259, 340; 714/795, 704; 370/347; 455/425

(56) References Cited

U.S. PATENT DOCUMENTS

| | | | |
|---|---|---|---|
| 4,742,533 A | | 5/1988 | Weidner et al. ............. 375/331 |
| 5,214,687 A | * | 5/1993 | Kansakoski et al. ......... 455/425 |
| 5,432,778 A | * | 7/1995 | Minde et al. ............... 370/347 |
| 5,944,844 A | * | 8/1999 | Piirainen et al. ............ 714/704 |
| 5,949,832 A | | 9/1999 | Brombaugh et al. ........ 375/344 |
| 6,134,278 A | | 10/2000 | Abrishamkar et al. ...... 375/344 |
| 6,163,571 A | * | 12/2000 | Asokan et al. ............. 375/225 |
| 6,215,831 B1 | * | 4/2001 | Nowack et al. ............ 375/340 |

* cited by examiner

Primary Examiner—Shuwang Liu
(74) Attorney, Agent, or Firm—Coats & Bennett, PLLC

(57) ABSTRACT

Biasing soft output values based on a known or learned bit error rate function yields performance improvements in decoding algorithms adapted to work with soft values, such as soft output Viterbi algorithms (SOVA). For example, in a wireless receiver, the soft output values output from a signal demodulator may be biased to reflect the changes in bit error rate across a given burst or block of data. Such changes might arise, for example, due to increasing inaccuracies in the receiver's channel estimate, which is typically computed at the beginning or middle of a block of received data. The wireless receiver may store a table of scaling factors corresponding to the expected bit error rate distribution of the received signal. The table may be preloaded into the receiver, or may be determined during operation. In either case, the table may be updated during operation to reflect bit error incidence observed during operation.

30 Claims, 5 Drawing Sheets

SOFT OUTPUT VALUE BIASING

BACKGROUND OF THE INVENTION

The present invention generally relates to wireless communication systems, and particularly relates to wireless communication receivers employing soft output value decoding.

The frequency of error in the data recovered from a received signal is a key parameter in assessing the performance of a wireless communication system. A wireless communication air interface standard typically defines the data encoding and signal modulation used by a transmitting terminal to generate a transmit signal, and the corresponding signal demodulation and decoding used by a compatible receiving terminal to recover the transmitted data. Many air interface standards include relatively sophisticated error correction encoding and interleaving techniques to enhance the reliability of the underlying data being transmitted. These techniques permit the receiving terminal to recover the data of interest from the received signal, even in the presence of bit errors in the encoded data at the receiving terminal.

One commonly used demodulation technique involves the generation of "soft" values, rather than hard values, at the receiving terminal. That is, instead of detecting binary ones and zeros, or discretely defined symbol values in the received signal, the receiving terminal generates a soft value that falls within the continuum of values between the discrete ideal values. The magnitude of a soft value generally reflects a "confidence" level. For example, in a system where the received signal at a given instant of time is meant to indicate either a +1 or a −1, a soft decision value might be 0.2, or −0.8. In the first case, the soft value indicates that a +1 was recovered from the received signal but with very low confidence, while the latter case indicates the recovery of a −1 with a relatively high confidence level. The additional information imparted by preserving the confidence level of a recovered bit or symbol may be used to enhance the performance of decoding operations involving the recovered value.

Many wireless receivers also employ some form of channel equalization to compensate the received signal for distortions caused by the communication channel. A channel equalizer essentially functions as a filter with a response that is the inverse of the channel. Commonly, the transmit signal includes a known sequence, often referred to as a "training sequence," that the receiving terminal uses to estimate the channel response. Because channel characteristics are subject to rapid change, the transmitter provides one or more training sequences repeated at short intervals, allowing the receiving terminal to continually update its channel estimate. However, even with a frequently updated channel estimate, the accuracy of the channel estimate may be expected to degrade as it ages. Thus, data recovered from the received signal may be expected to exhibit an increasing bit error rate with increasing channel estimate age.

BRIEF SUMMARY OF THE INVENTION

The present invention provides a method and apparatus for biasing soft values generated from a received signal based on an expected bit error distribution to reduce the bit error rate at the output of a channel decoder. For example, a wireless receiving terminal may demodulate a received signal to generate a sequence of soft values that are then scaled by a corresponding sequence of scaling factors before or during soft value decoding. The set of scaling factors embodies the expected bit error rate distribution for the sequence of soft values, with individual scaling factors generally having magnitudes that decrease as the expected bit error rate for the corresponding sequence position increases. That is, each bit position in the demodulator output has a corresponding scaling factor determined by the relative incidence of bit error at that bit position. Bit positions with a relatively low incidence of error will high a correspondingly high scaling factor, and bit positions with a relatively high incidence of error will have a correspondingly low scaling factor.

Soft output value biasing in accordance with the present invention is applicable to a variety of equalizers and demodulators configured to generate soft output values from a received signal. Such devices may be found in a variety of radio communication devices, such as mobile terminals for use in CDMA or TDMA communication systems. In a mobile terminal, the expected bit error rate distribution of the received signal may be preprogrammed into the terminal for use by its receiver in biasing soft values during reception operations. Alternatively, the terminal may be configured to generate the biasing information based on actual or observed bit error distributions determined from received data. The two approaches may be combined in that the terminal may be preprogrammed with default biasing information that is refined or updated based on observed bit error distribution during subsequent operation.

DETAILED DESCRIPTION OF THE INVENTION

Figure 1:
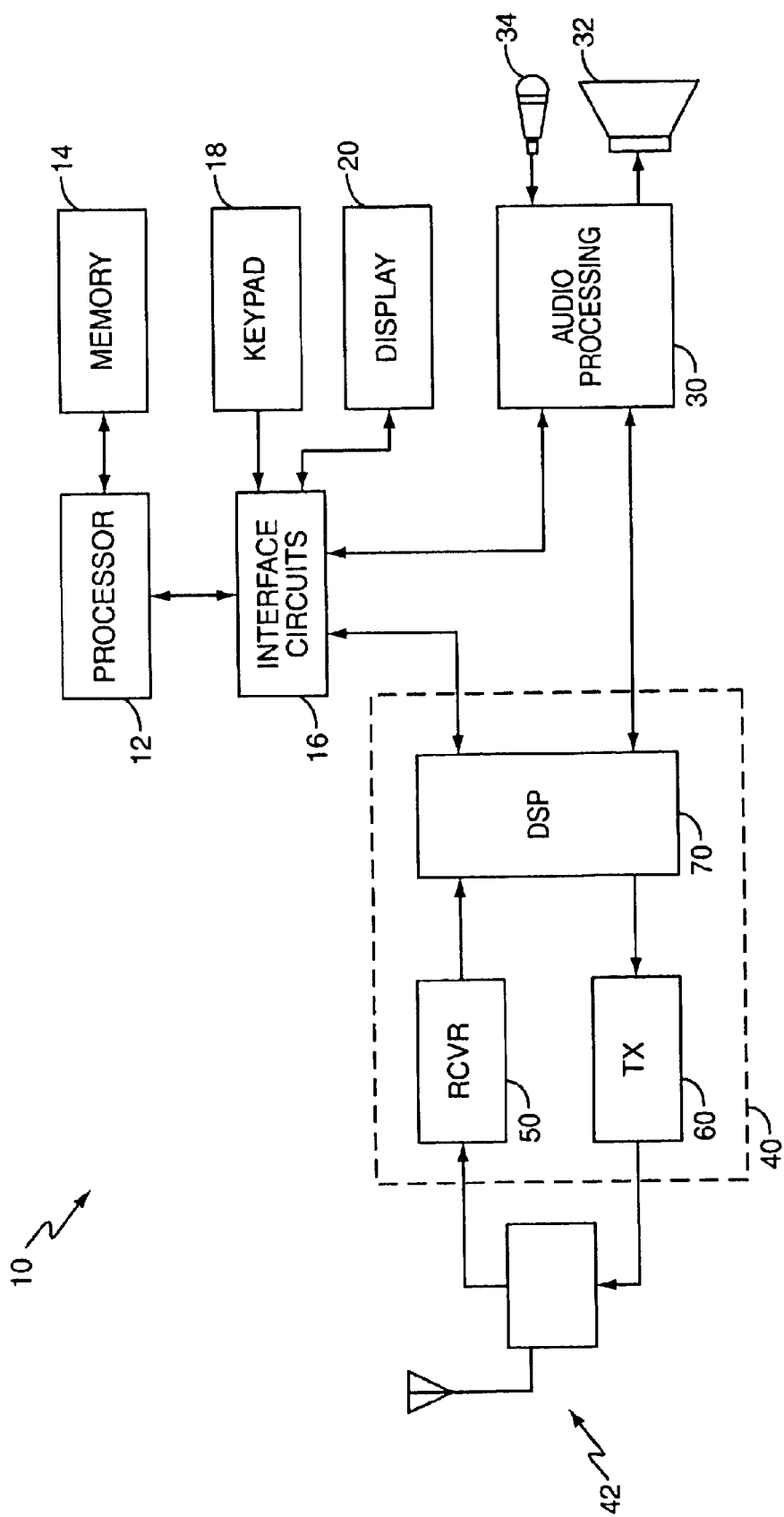
FIG. 1 is a functional block diagram of mobile terminal implementing the biasing method of the present invention.

Referring now to FIG. 1, a mobile wireless communication device, or mobile terminal, implementing the demodulation method of the present invention is shown therein and is indicated generally by the numeral 10. Mobile terminal 10 comprises a main processor 12 for controlling the operation of the mobile terminal 10 and memory 14 for storing control programs and data used by the mobile terminal 10 during operation. The processor 12 can be any commercially available or custom microprocessor or microcontroller, and may actually comprise several processing devices.

Memory 14 is representative of the overall hierarchy of memory devices containing the software and data used to implement the functionality of the mobile terminal 10. Memory 14 can include, but is not limited to, the following types of devices: cache, ROM, PROM, EPROM, EEPROM, Flash, SRAM, and DRAM.

Input/output circuits 16 interface the processor 12 and memory 14 with a keypad 18, display 20, audio processing circuits 30, and transceiver 40. The keypad 18 and display 20 provide a user interface that allows the user to interact with the mobile terminal 10. Keypad 18 allows the user to dial numbers, enter commands and data, and select options. The display 20 allows the operator to see dialed digits, stored information, call status information, and output from various applications running on the mobile terminal 10.

The mobile terminal 10 includes a transceiver 40 which may, for example, comprise a fully functional cellular radio transceiver 40 that communicates with a base station (not shown) in a public land mobile network. Transceiver 40 typically comprises a receiver 50 and a transmitter 60 to receive and transmit signals using a shared antenna assembly 42. The transceiver 40 also typically includes a digital signal processor (DSP) 70 for processing signals transmitted to and received by the mobile terminal 10. For transmitted signals, the functions of the DSP 70 include channel coding, error correction encoding, interleaving, and modulation of the transmitted signals. For received signals, the DSP 70 also performs demodulation, de-interleaving, and channel decoding of the received signals. Of course these functions or any combination thereof may be performed using one or more ASICs, or other dedicated hardware (not shown).

The audio processing circuits 30 provide basic analog audio outputs to a speaker 32 and accept analog audio inputs from a microphone 34. Microphone 34 converts audible sounds, such as voice, into electrical signals that are input to the audio processing circuits 30. The transmitter 60 may then transmit the processed audio signals. Speaker 32 converts audio signals output by said audio processing circuits 30 into audible sounds that can be heard by the user.

Figure 2:
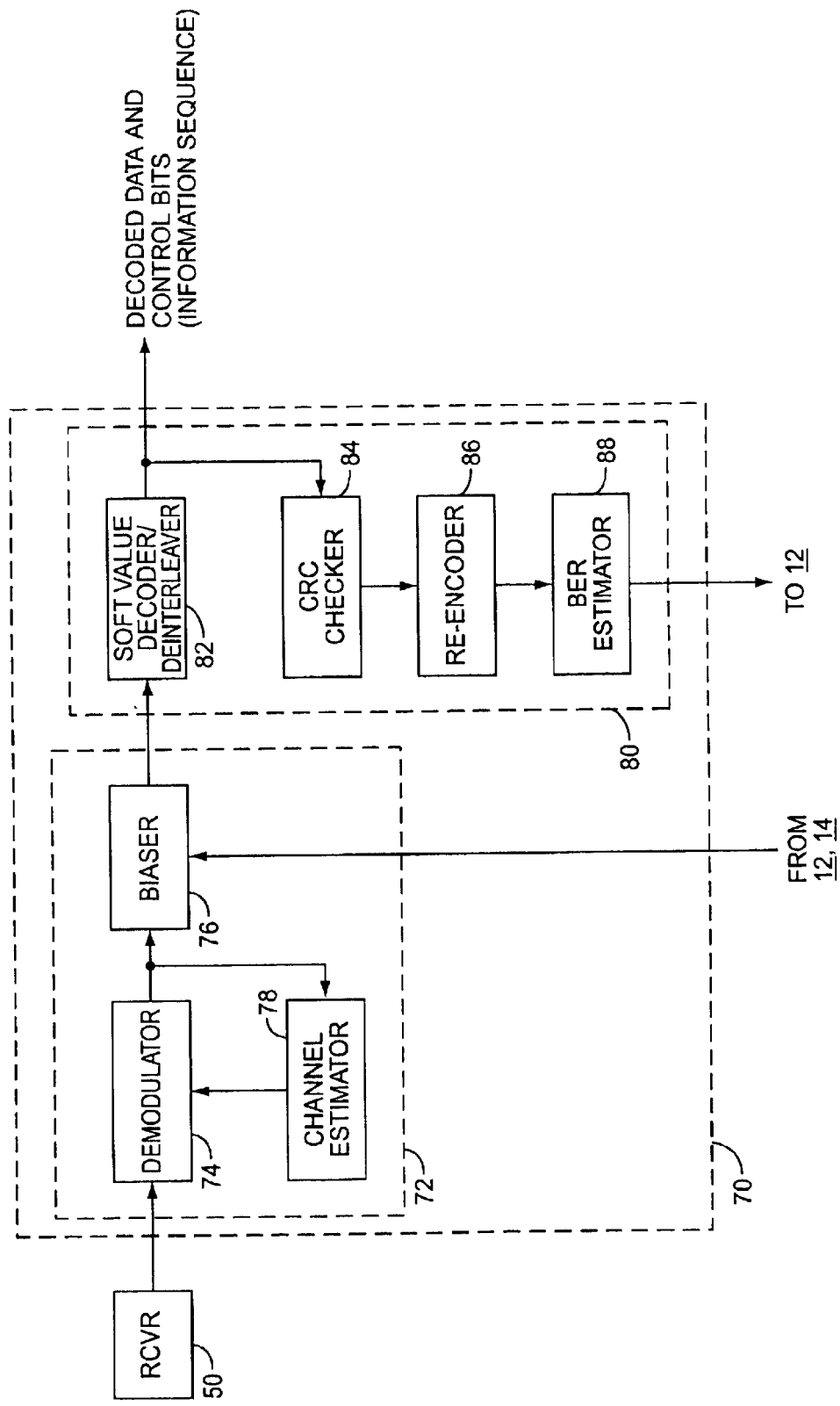
FIG. 2 is a functional block diagram illustrating the received signal processing performed by the mobile terminal of FIG. 1.

FIG. 2 is a functional block diagram illustrating how the DSP 70 processes received signals passed to it by the receiver 50. Receiver 50 filters and amplifies the received signal, converts the received signal to the baseband frequency, and digitizes the received signal for processing by the DSP 70. DSP 70 comprises a demodulation circuit 72 to demodulate the received signal, and a decoding circuit 80 to detect and correct bit errors in the received signal. In the exemplary embodiment described herein, the output of the demodulation circuit 72 is a sequence of soft values, also referred to as soft output values, rather than hard decisions.

The soft output values reflect the confidence with which the individual demodulated values have been recovered. For example, rather than indicating the reception of a logical "1," the demodulation circuit 72 might output "0.8" to indicate the receipt of a "1" with high confidence, or might output "0.2" to indicate the receipt of a "1" with low confidence.

The decoding circuit 80 receives the soft output values from the demodulation circuit 72 and decodes those soft output values to replicate an information sequence that was transmitted by the transmitter. The decoding circuit 80 incorporates a soft-value decoding algorithm, such as a Soft Output Viterbi Algorithm (SOVA) or some other soft-value decoding technique. Examples of other decoding techniques include the maximum a posteriori probability (MAP) algorithm, which uses symbol error probability as the optimization criterion. The book *Error Control Coding: Fundamentals and Applications*, S. Lin & D. J. Costello, Jr. (1983), provides details regarding the use of soft demodulator outputs in SOVA decoding applications and is incorporated in its entirety herein by reference.

In the absence of decoding errors, the information sequence output from the decoding circuit 80 will be an exact replica of the originally transmitted information sequence. Due to noise and other causes of interference, such as multipath fading, some bit errors will occur in the output of the decoding circuit 80.

In general, soft value demodulation improves the bit error performance of the transceiver 40. The performance gains offered by soft value decoding depend to some extent on a relatively uniform noise power in the received signal across the period of interest, which is normally at least one received slot or block of data. As an example of why noise power in the received signal might increase, consider signal distortions caused by the radio channel.

In typical wireless signals, such as those based on standards like cdma2000, TIA/EIA-136, GSM, and others, the received signal contains a training sequence or other predetermined training data that is repeated at frequent intervals. The training sequence is known to the mobile terminal 10 and is used by it to calculate an estimated channel response. The demodulation circuit 72 compensates the received signal using the estimated channel response, effectively removing channel-induced distortions in the received signal. However, the extent to which the channel distortions are effectively canceled depends on the accuracy of the channel estimate.

The channel estimate's accuracy may be expected, in general, to degrade as it ages. This degradation arises because of the rapidly changing characteristics of the typical radio channel in a mobile environment. For this reason, the demodulation circuit 72 typically updates its current channel estimate (or estimates) rapidly. For example, in a GSM environment, the demodulation circuit 72 usually updates the channel estimate(s) used over an assigned 576 us time slot at the 4.6 ms frame rate. Despite the short update interval, there remains a general tendency for the channel estimate(s) in use by the demodulation circuit 72 to decrease in accuracy over the update interval.

Notably, substantially the same scenario as above applies in CDMA systems making use of known pilot symbols as reference values for channel estimation in received signal demodulation. In such systems, channel estimation error may tend to increase as demodulation progresses away from the point of estimation. Thus, as noted elsewhere herein, the method of the present invention has utility in a broad range of communication types, including TDMA and CDMA-based wireless communication systems.

Figure 3:
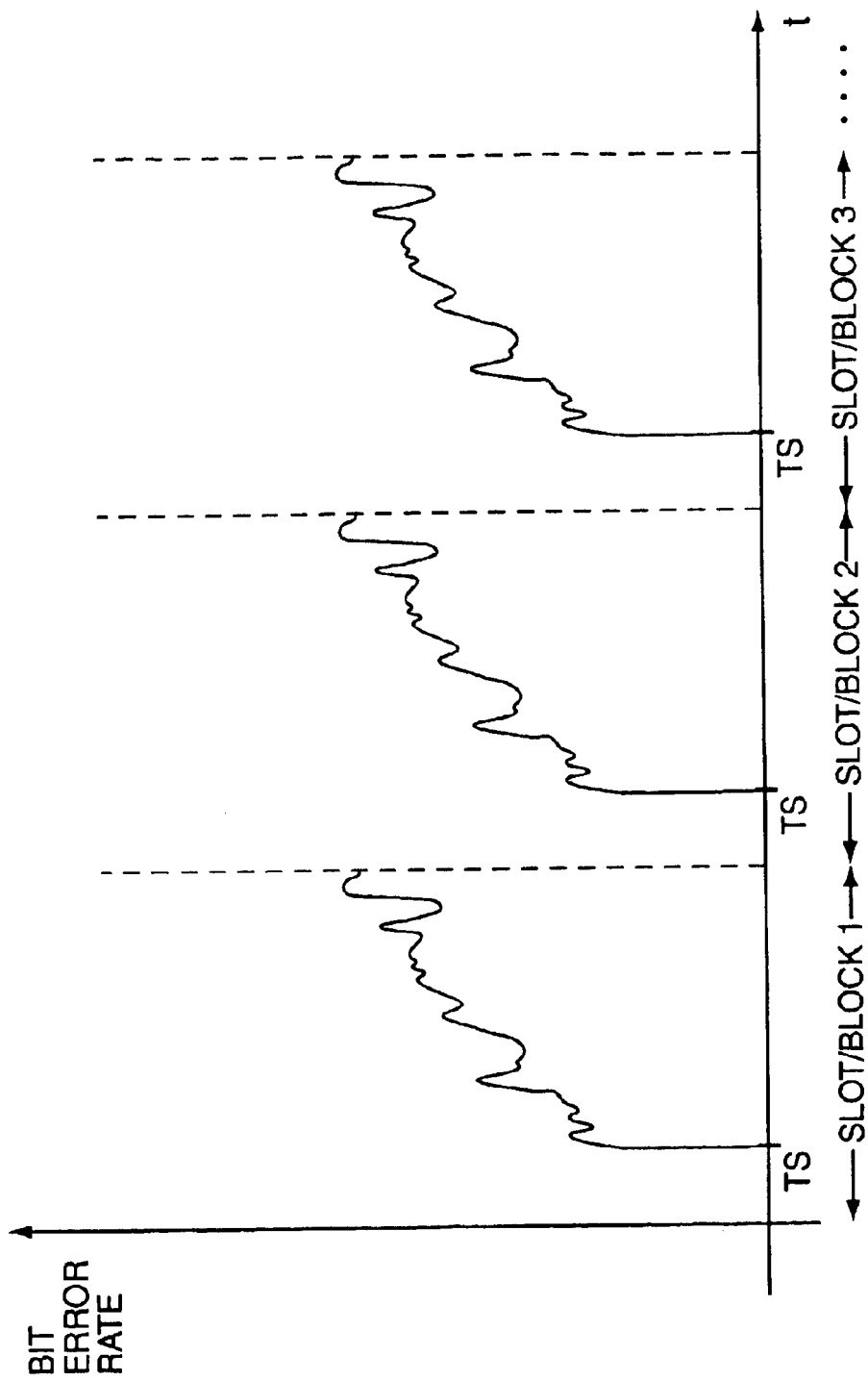
FIG. 3 is a diagram of a hypothetical expected bit error distribution curve for a generalized wireless signal.

FIG. 3 is a diagram of a hypothetical bit error distribution for a typical sequence of time slots or data blocks in a received signal. As illustrated, the initial portion of the received signal in each slot or block contains a sequence of known training values used by the transceiver 40 to update its channel estimate(s). The demodulation circuit 72 knows the training sequence values in advance and the bit error rate for that portion of the signal is considered to be zero.

At the conclusion of each training sequence, the demodulation circuit 72 operates with a channel estimate that ideally matches the actual channel response conditions exactly. More practically, the channel estimate is a close approximation of the radio channel's actual response. However, as the radio channel is subject to rapid change, the likelihood is that the accuracy of the channel estimate degrades with increasing time. Thus, the further away a received value is from the training sequence in the slot or block, the more prone it is to bit error. Here, bit error refers to the incidence of bit error in the decoded bits output by the decoding circuit 80.

In the above example, the bit error rate distribution exhibited in the received signal arises, at least in part, from a generally increasing demodulation noise power associated with a generally increasing inaccuracy in the channel estimate used by the demodulation circuit 72. From another perspective, a soft output value output by the demodulation circuit 72 may be thought of as representing the signal-to-noise ratio (SNR) of the corresponding demodulated bit, provided the noise power is the same from bit to bit.

The degradation in channel estimate accuracy between channel estimate updates causes a generally increasing demodulation noise across a given slot. However, as FIG. 3 illustrates, the bit error rate distribution arising from channel estimation techniques is not a linear function, nor even a monotonic function. Indeed, the generalized case of the received signal exhibiting, in general, some known or expected bit error distribution, may involve virtually any type of distribution function, including discontinuous functions. Further, in the case of bit error distribution arising from channel estimation techniques as described above, the particular bit error distribution exhibited by the received signal depends on the arrangement of the training sequences themselves. For example, in a GSM TDMA slot, the training sequence is positioned in the middle of the slot.

The present invention compensates for an expected or known bit error distribution in the received signal. The discernable bit error distribution may arise, for example, from repeating variations in demodulation noise power related to channel estimate as discussed above. Of course, the expected bit error distribution may arise for other reasons, or from a combination of factors that may include channel estimation aging.

In one exemplary embodiment of the present invention, a look-up table of bias values, which are also referred to as scaling factors, is used to adjust or bias the soft output values provided by the demodulation circuit 72 based on their position within the received signal slot or block. In this way, each soft output value may be biased to reflect the relative occurrence of bit errors for its corresponding bit position in the received signal. In this context, adjusting or biasing the soft output values denotes adjusting their magnitudes based on the expected or known bit error distribution as represented by the bias value table.

Figure 4:
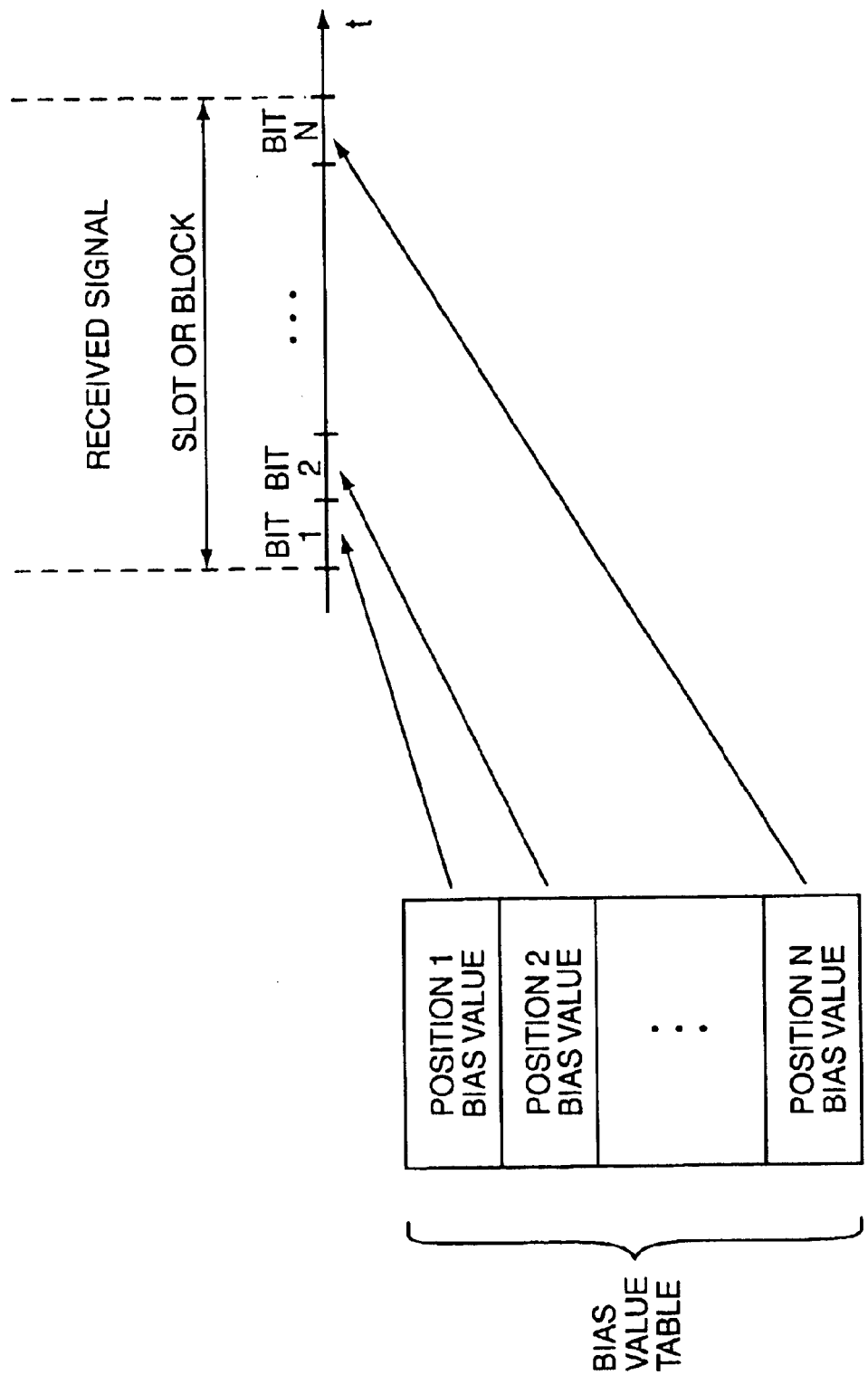
FIG. 4 is a diagram of the correspondence between received signal bit position and bias value in an exemplary implementation of the present invention.

An exemplary bias value table is shown in FIG. 4. In practice, the bias value table contains a set of numerical values corresponding to the known or expected bit error distribution. For example, for a bias table value corresponding to a bit position in a received signal slot or block exhibiting a high incidence of bit error relative to the other bit positions may be expected to contain a relatively small bias value. Conversely, a bias table value corresponding to a bit position in the slot or block with low expected incidence of bit error would have a relatively large bias value. In other words, the confidence level of a soft output value is adjusted based on the expected bit error for that soft value's bit position in the received signal sequence of interest.

The bias values may range, for example, from 0.5 to 1. In this example, the soft output value corresponding to the bit position in the received signal with the highest incidence of bit error might be multiplied by "0.5," while the soft output value corresponding to the bit position with the lowest incidence of bit error might be multiplied by "1." Soft output values corresponding to bit positions with bit error incidences between these two extremes would be multiplied by the appropriate value between 0.5 and 1. Thus, the bias table values act as scaling factors for their corresponding soft output values.

Different bit positions may have the same corresponding bias value, and different ranges of bias values may be used. Generally, the offset or absolute magnitude of the soft output values is not important in terms of decoder operation. Thus, for the above example, the basic technique reduces to multiplying a soft output value by a bias value having a magnitude proportionate to the expected incidence of bit error for that soft output value. As an example, one could decrease the magnitude of a bias value as the bit error rate for the corresponding sequence position increased.

It is not necessary that each received signal position have a corresponding bias value in the bias value table. For example, in a TIA/EIA-136 TDMA time slot there are 324 data bit positions. If a one-to-one correspondence were adopted for the bias value look up table, the table would have 324 bias values. The table may contain fewer than 324 values, and the receiver could interpolate or extrapolate between values to make up the difference. However, as will be shown later, expected bit error distributions are typically determined statistically over repeated measurements and are subject to significant variation between adjacent bit positions, making any interpolation or curve fitting approach potentially difficult.

The bias value table of FIG. 4 may be developed based on simulated performance of the mobile terminal 10, or may be determined by empirical measurement. For example, the bias table values for the mobile terminal 10 may be determined in a development environment through simulation, or by empirical measurements made over time during operation of the mobile terminal 10. Such operations develop statistically accurate representations of bit error distribution and provide a method for determining the bias table values.

The mobile terminal 10 may be configured at the time of manufacture, or before delivery to the user, with a default bias value table representing the bit error distribution that may be expected for the mobile terminal 10 in actual operation. The bias table values may be stored, for example, in memory 14. As noted, memory 14 may comprise several memory devices, and can include non-volatile storage for the bias table values.

As an added refinement of the bias value table concept discussed above, the mobile terminal 10 may include additional circuitry or processing functions to determine the actual received bit error distribution. This type of operation is generally supported in wireless communication systems. For example, a TIA/EIA-136 TDMA slot includes a number of so-called "class 1" bits, which are Cyclic Redundancy Check (CRC) encoded. On the transmit side, these class 1 bits are interleaved across the TDMA slot.

The mobile terminal 10 can effectively develop a profile of received bit errors across the entire slot by performing a CRC to detect class 1 bit errors in the output of the decoding circuit 80. Over time, by observing the incidence of bit error across a large number of times slots, the mobile terminal 10 can use observed bit error distribution to generate or update its bias value table information. Essentially, the mobile terminal 10 adapts or adjusts the bias value table over time to reflect the observed bit error distribution of the received signal.

A further alterative eschews the use of a default bias value table, relying instead on the mobile terminal 10 to determine any tendencies in the received signal bit error distribution over time. The mobile terminal 10 could then use this information to generate values for a bias table, or may use the information to generate a functional representation of received signal bit error distribution. Using a functional representation involves computing values for one or more equations that correspond to the expected bit error distribution. Various generator functions and curve fitting techniques to support this approach are well understood.

Referring back to FIG. 2, the demodulation circuit 72 comprises a soft-value demodulator 74, a biaser 76, and a channel estimator 78. In operation, the soft-value demodulator 74 generates soft output values based on demodulating the received signal. The channel estimator 78 develops one or more channel estimates, which are then used by the demodulator 74 to compensate the received signal for estimated channel distortions. The soft output values from the demodulator 74 pass to the biaser 76, which scales them using bias values.

The biaser 76 adjusts the soft output values from the demodulator 74 in accordance with the above discussion. That is, the biaser 76 biases the soft output values from the demodulator 74 in accordance with a known or expected bit error distribution associated with the received signal. As such, the biaser 74 receives bias values from, for example, a bias value look-up table stored in memory 14. The biaser 76 may directly access stored bias values if, for example, the DSP 70 has access to memory 14. Alternatively, bias values may be passed to the biaser 76 indirectly by the processor 12, or other logic interface.

As before, the bias value look table held in memory 14 may include a bias value corresponding to every bit position in the received signal sequence. Thus, if the mobile terminal 10 is configured to work in a TIA/EIA-136 communication environment, the bias table preferably includes 324 bias values corresponding to the 324 data bit positions in a single TDMA time slot.

As noted, these bias table values may be updated or refined by the mobile terminal 10 during its operation. In general, the mobile terminal 10 can discern bit error distributions in the received signal over time, based on tracking bit error occurrence relative to bit position within the received signal. Bit error determination is performed in the exemplary embodiment by the decoding circuit 80, which is shown in FIG. 2.

The decoding circuit 80 comprises a soft-output value decoder 82, a CRC checker 84, a re-encoder 86, and bit error rate (BER) estimator 88. Decoder 82 may, for example, comprise a Soft Output Viterbi Algorithm (SOVA) decoder. Selected bits output by the decoder 82 may be re-encoded by the re-encoder 86 to identify bit errors, which allows the BER estimator 88 to generate a bit error value indicative of the bit error rate performance of the mobile terminal 10.

The CRC checker 84 detects decoding errors in the CRC-encoded bits within the received signal. As an example, the CRC checker 84 may operate on the class 1 encoded bits in a TIA/EIA-136 signal. As these bits are distributed across the TDMA slot in the received signal, a bit error distribution for the received signal may be developed by tracking incidence of bit error relative to slot position. The bias value table may then be updated to reflect the observed bit error distribution in the received signal.

Figure 5:
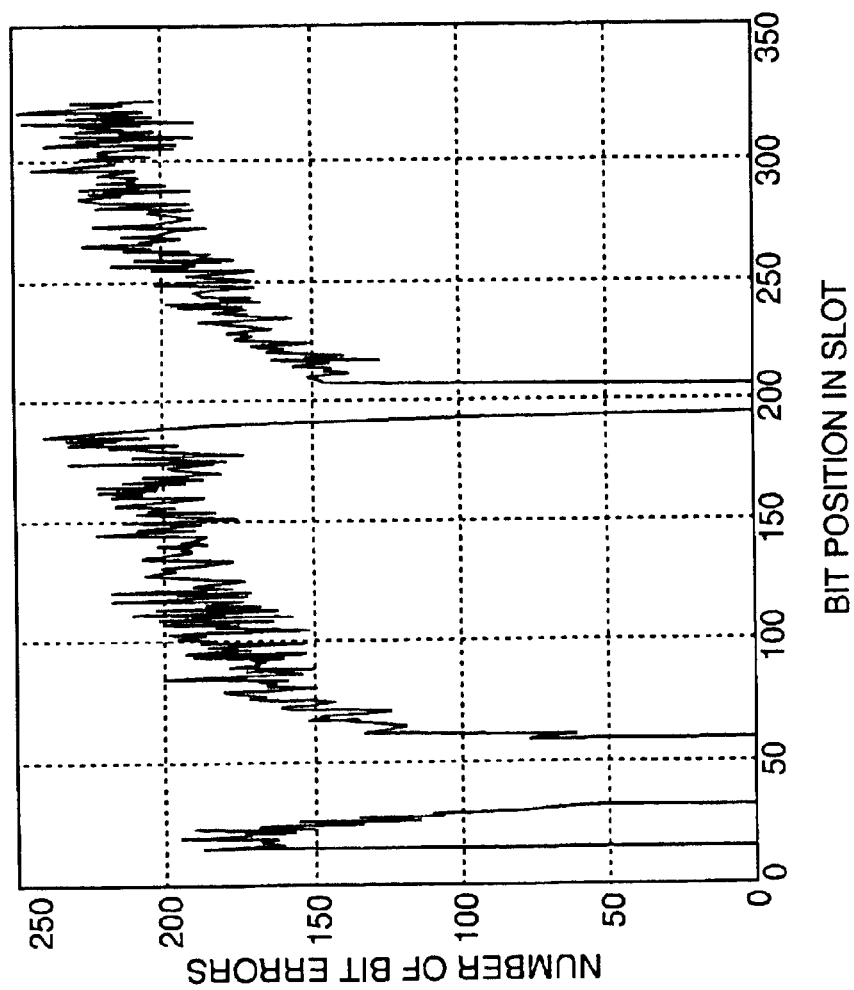
FIG. 5 is a diagram of empirically determined bit error distribution for a given type of received signal.

FIG. 5 is a diagram of empirically determined bit error distribution for TIA/EIA-136 TDMA slots. The graph is based on demodulation using a channel-tracking equalizer, and assumes a quarter-symbol dispersive, fast-faded channel. The term "quarter-symbol dispersive" refers to the delay spread in multipath signal reception relative to the width of a single symbol time in the received signal. The gaps in the distribution represent the location of the synchronization word and the Coded Digital Verification Color Code (CDVCC), which are considered known. Note that the bit error distribution values depicted on the vertical axis of the graph were developed over a number of received signal time slots.

While the graph depicts a specific signal type (e.g., TIA/EIA-136), the mobile terminal 10 may be designed to work with different received signal types. The differing signal types may exhibit different bit error distributions. Thus, the mobile terminal 10 may use multiple bias value tables. During operation, the mobile terminal 10 would select bias values from the table corresponding to the current received signal type.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of reducing bit errors in data recovered from a sequence of soft output values, the method comprising:
   demodulating a received signal to produce a received sequence comprising soft output values corresponding to a sequence of symbols in said received signal;
   biasing said soft output values based on an expected bit error rate distribution in said received signal to produce a sequence of adjusted soft output values.

2. The method of claim 1 wherein biasing said soft output values based on an expected bit error rate distribution in said received signal to produce a sequence of adjusted soft output values comprises:
   determining a scaling factor for each soft output value based on said expected bit error rate distribution in said received signal; and
   scaling each soft output value by the corresponding scaling factor.

3. The method of claim 2 wherein determining a scaling factor for each soft output value based on the expected bit error rate distribution in said received signal comprises accessing a data table of scaling factors corresponding to the expected bit error rate distribution.

4. The method of claim 1 further comprising decoding said sequence of adjusted soft output valves in a decoder.

5. The method of claim 4 wherein biasing said soft output valves based on an expected bit error rate distribution in said received signal to produce a sequence of adjusted soft output valves is performed by said decoder.

6. The method of claim 5 further comprising:
   observing bit errors in decoded bits generated by decoding said sequence of adjusted soft output values; and
   updating the expected bit error rate distribution for the received signal based on the observed bit errors.

7. The method of claim 6 wherein observing the bit errors in decoded bits generated by decoding said sequence of adjusted soft output values comprises:
   determining said bit errors in said received signal by decoding said received sequence to produce a decoded sequence;
   re-encoding said decoded sequence to produce a re-encoded sequence; and
   comparing said re-encoded sequence to said received sequence to detect bit errors.

8. The method of claim 1 wherein demodulating a received signal to produce a received sequence comprising soft output values corresponding to a sequence of symbols in said received signal comprises:
   receiving a burst transmission in a defined time slot in a TDMA signal as the received signal; and demodulating the burst transmission to generate said sequence of soft output values.

9. The method of claim 8 wherein the burst transmission received in the defined time slot comprises a known training sequence, and further comprising scaling each soft output value based on a position of the soft output value within the sequence of soft output values relative to the known training sequence.

10. The method of claim 8 wherein the burst transmission includes a number of verifiable encoded data bits distributed across the burst transmission, and further comprising:
   determining an observed bit error distribution across the burst transmission based on decoding the verifiable encoded data bits; and
   updating the expected bit error distribution based at least in part on the observed bit error distribution.

11. The method of claim 1 wherein further comprising generating a corresponding sequence of hard output values based on decoding said sequence of adjusted soft output values using a soft output Viterbi algorithm (SOVA).

12. The method of claim 1 wherein biasing said soft output values based on an expected bit error distribution in said received signal to produce a sequence of adjusted soft output values comprises scaling each soft output value in said sequence of soft output values in inverse proportion to an expected incidence of bit error corresponding to the position of the soft output value within said sequence of soft output values.

13. The method of claim 1 wherein demodulating a received signal to produce a received sequence comprising soft output values corresponding to a sequence of symbols in said received signal comprises:
   receiving a CDMA signal as the received signal; and
   demodulating the CDMA signal to generate said sequence of soft output values.

14. The method of claim 13 further comprising:
   receiving known pilot symbols in association with the CDMA signal;
   generating a channel estimate based on the known pilot code, wherein the channel estimate is used in said demodulation of the CDMA signal; and
   scaling each soft output value based on a position of the soft output value relative to the point in time at which the channel estimate was generated.

15. A method of reducing the bit error rate of data recovered from a received signal, the method comprising:
   demodulating said received signal to generate a sequence of soft output values;
   scaling each soft output value based on an expected bit error rate distribution for the received signal; and
   decoding said sequence of scaled soft output values to recover data bits encoded into said received signal.

16. The method of claim 15 wherein scaling each soft output value based on an expected bit error rate distribution for the received signal comprises compensating a magnitude of each soft output value with a scaling factor corresponding to the position of each said soft output value within said sequence of soft output values.

17. The method of claim 16 wherein compensating a magnitude of each soft output value with a scaling factor corresponding to the position of each said soft output value within said sequence of soft output values comprises multiplying each said soft output value by the corresponding scaling factor.

18. The method of claim 16 further comprising accessing a data table containing a plurality of scaling factors corresponding to the plurality of positions within said sequence of soft output values to retrieve a corresponding scaling factor for each said soft output value in said sequence of soft output values.

19. The method of claim 18 further comprising:
   determining average bit errors across repeated sequences of soft output values; and
   updating said data table based on said average bit errors.

20. The method of claim 15 wherein scaling each soft output value based on an expected bit error rate distribution for the received signal comprises:
   accessing a data table containing a set of scaling factors, each said scaling factor corresponding to an expected bit error rate for a corresponding position within said received signal; and
   scaling each said soft output value in the sequence of soft output values with a corresponding one of said scaling factors.

21. The method of claim 20 further comprising:
   determining said expected bit error rate distribution for said received signal; and
   generating said data table of scaling factors based on the determined bit error rate distribution of said received signal.

22. The method of claim 15 wherein scaling each soft output value based on an expected bit error rate distribution for the received signal comprises for each soft output value in a sequence of soft output values generated from the received signal, scaling the soft output value by a bias value having a magnitude determined by a bit error rate corresponding to the position of the soft output value in the sequence of soft output values.

23. The method of claim 22 further comprising updating the expected bit error rate distribution for received sequences of soft output values generated from the received signal by observing bit errors in data decoded from a plurality of sequences of soft output values.

24. A wireless access terminal comprising:
   a demodulator to generate a sequence of soft output values based on demodulating a received signal;
   a biaser to scale each soft output value based on an expected bit error rate distribution of said received signal; and
   a soft-value decoder to output recovered data bits based on decoding said sequence of scaled soft output values.

25. The wireless access terminal of claim 24 further comprising a memory element holding a table of scaling values for use by said biaser in scaling said soft output values.

26. The wireless access terminal of claim 25 further comprising:
   bit error detection circuitry to determine actual bit errors in said received signal; and
   control logic to update said table of scaling values held in said memory element based on said actual bit errors determined for said received signal.

27. The wireless access terminal of claim 25 wherein said control logic comprises a controller cooperating with said bit error detection circuitry to update said table of scaling values held in said memory element.

28. The wireless access terminal of claim 24 wherein said decoder comprises a soft-output value Viterbi algorithm (SOVA) decoder.

29. The wireless access terminal of claim 24 wherein said biaser comprises a portion of said decoder, and wherein said biaser scales said soft output values during decoding operations of said decoder.

30. The wireless access terminal of claim 24 wherein said biaser comprises a multiplier to scale soft output value magnitudes by multiplying each said soft output value by a corresponding scaling factor selected from a set of scaling factors representative of said expected bit error rate distribution of said received signal.

* * * * *